(12) United States Patent  
Radziun et al.

(10) Patent No.: US 6,636,136 B1
(45) Date of Patent: Oct. 21, 2003

(54) MECHANICAL STABILIZER-TUNED DAMPER FOR HIGH FIELD OPEN MAGNET

(75) Inventors: Michael J. Radziun, Waterford, WI (US); Scott T. Mansell, Waterford, WI (US); Andrew T. Bollinger, Atlanta, GA (US); Long-Zhi Jiang, Florence, SC (US); Gregory A. Lehmann, Florence, SC (US); Timothy J. Havens, Florence, SC (US); Yu Wang, Clifton Park, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 65 days.

(21) Appl. No.: 09/737,084

(22) Filed: Dec. 14, 2000

(51) Int. Cl.⁷ .................................................. H01F 5/00
(52) U.S. Cl. ........................................ 335/299; 335/216
(58) Field of Search ......................... 335/216, 296–299

(56) References Cited

U.S. PATENT DOCUMENTS 5,864,273 A * 1/1999 Dean et al. ................. 335/216

6,150,912 A * 11/2000 Elgin, II et al. ............. 335/299

\* cited by examiner

*Primary Examiner*—Lincoln Donovan
*Assistant Examiner*—Tuyen T. Nguyen
(74) *Attorney, Agent, or Firm*—Joseph S. Heino; Carl B. Horton

(57) ABSTRACT

A mechanical stabilizer-tuned damper is attachable to the first upper magnet assembly of a high field open magnet, which magnet includes a first upper magnet assembly, a lower second magnet assembly and at least one non-magnetizable support beam therebetween. The mechanical stabilizer-tuned damper reduces the dynamic response of the magnet. A connecting device is provided which consists of a threaded rod mounted to an attachment bracket through a linear bearing and vibration mount. A series of non-magnetic and extremely low conductivity plates of various weights are attachable to the rod to change the mass and the tuning frequency of the damper. The location and size of the mechanical stabilizer-tuned damper are determined to balance the frequency of the field oscillation and physical room. The direction of orientation depends upon the direction of motion to be dampened or controlled.

30 Claims, 2 Drawing Sheets

MECHANICAL STABILIZER-TUNED DAMPER FOR HIGH FIELD OPEN MAGNET

BACKGROUND OF THE INVENTION

The present invention relates generally to open magnets, and more particularly to a mechanical stabilizer-tuned damper attached to an open magnet.

As is well known, a magnet coil can be made superconductive by placing it in an extremely cold environment, such as by enclosing it in a cryostat or pressure vessel containing liquid helium or other cryogenic liquid. The extreme cold reduces the resistance of the magnet coil to negligible levels, such that when a power source is initially connected to the coil to introduce a current flow through the coil, the current will continue to flow through the coil due to the negligible coil resistance even after power is removed, thereby maintaining a strong magnetic field. Known superconductive magnet designs include closed magnets and open magnets.

Closed magnets typically have a single, tubular shaped resistive or superconductive coil assembly having a bore. The coil assembly includes several radially-aligned and longitudinally spaced-apart superconductive main coils each carrying a large, identical electrical current in the same direction. The main coils are thus designed to create a magnetic field of high uniformity within a typically spherical imaging volume centered within the magnet's bore where the object to be imaged is placed.

Open magnets typically employ two spaced-apart coil assemblies with the space between the assemblies containing the imaging volume and allowing for access by medical personal for surgery or other medical procedures during magnetic residence imaging. The open space helps the patient overcome any feelings of claustrophobia that may be experienced in a closed magnet design.

The high field open (hereinafter "HFO") magnet also utilizes superconducting magnet technology to generate its magnetic field. The HFO magnet essentially rotates a cylindrical magnet to the vertical position. The rotation of the magnet by itself seems relatively inconsequential. As a result of the relatively high center of gravity of the magnet, however, the mechanical structure can move dynamically with very little mechanical force applied to the HFO magnet. In the field of magnetic resonance imaging (hereinafter "MRI"), the requirement for main field magnetic stability is well documented. Physical magnet mechanical motion can generate magnet field disturbances. The sharpness of an MRI image depends, in part, on the magnetic field in the imaging volume being time-constant and highly uniform. Magnet vibration can cause spatial and time domain magnetic field distortion. In the case of the HFO magnet, the high center of gravity and the relatively small magnet footprint inherently creates a mechanically unstable magnet. What is needed is a mechanical stabilizer-tuned damper to minimize the magnet motion, thus reducing the risk of image phase ghosting, by reducing the amplitude of motion at very specific vibration frequencies. The mechanical stabilizer-tuned needs to be designed to dissipate vibratory motion at a specific frequency and direction of motion. The physical magnet structure is fitted to accept a mechanical stabilizer-tuned damper. The orientation of the mechanical stabilizer-tuned damper can be either in the vertical or horizontal plane, depending upon the direction of motion to be controlled.

BRIEF SUMMARY OF THE INVENTION

In an illustrative embodiment of the invention, a high field open magnet includes a first upper magnet assembly, a lower second magnet assembly, at least one nonmagnetizable support beam, and a mechanical stabilizer-tuned damper assembly mounted to the first magnet assembly. Each magnet assembly includes a longitudinally-extending axis, at least one superconductive main coil generally coaxially aligned with the axis, a vacuum enclosure enclosing the assembly's at least one main coil. The first axis of the first upper magnet assembly is generally vertically aligned, the second lower magnet assembly is positioned generally vertically below the first assembly, and the second axis of the second assembly is generally coaxially aligned with the first axis. The at least one support beam is generally vertically aligned and has a first longitudinal end attached to the first assembly and a second end attached to the second assembly. A support skirt is provided which is generally longitudinally-extending, annularly-cylindrical and generally coaxially aligned with the second axis, the skirt having a first longitudinal end attached to the second assembly and a second longitudinal end which can be supported by a floor. The first magnet assembly is fitted to accept a mechanical stabilizer-tuned damper assembly. The mechanical stabilizer-tuned damper is designed to reduce the dynamic response of the primary structure, the magnet. A connecting device is provided which consists of a threaded rod mounted to an attachment bracket through a linear bearing and vibration mount. A series of non-magnetic and extremely low electrical conductivity plates are provided to change the mass and therefore the tuning frequency of the damper. The location and size of the mechanical stabilizer-tuned damper are determined to balance the frequency of the field oscillation and the physical room. The direction of orientation can either be in the vertical or horizontal plane, depending on the direction of motion sought to be controlled. Either single or multiple mechanical stabilizer-tuned dampers can be fitted to detune one or more displacement components, or frequencies.

Several benefits and advantages are derived from the invention. It is noted that, in a vertically-aligned HFO magnet, when the support members provide a "clam-shell" support for the assemblies, such assemblies are particularly subject to vibration. Such clam-shell support is a very open support providing ease of patient table access to the imaging volume and providing ease of patient positioning within the imaging volume. Engineering analysis shows that the mechanical stabilizer-tuned damper design of the invention reduces magnet vibrations in a vertically-aligned open magnet having a clam-shell support for the assemblies. The mechanical stabilizer-tuned damper mass motion is aligned to dampen the direction of motion of the magnet. The mechanical stabilizer-tuned damper has the ability to add or subtract mass to fine-tune the magnet motion frequency to the natural frequency of the tuned damper. Engineering analysis also shows that mechanical stabilizer-tuned damper assemblies fitted to the magnet structure reduce the amplitude of motion at very specific oscillatory frequencies, particularly at the dominant low-excitation frequencies to which the open magnet is susceptible. When the tuned-damper magnet motion is properly matched, the amplitude of motion will reduce by as much as one order of magnitude.

DETAILED DESCRIPTION OF THE INVENTION

Figure 1:
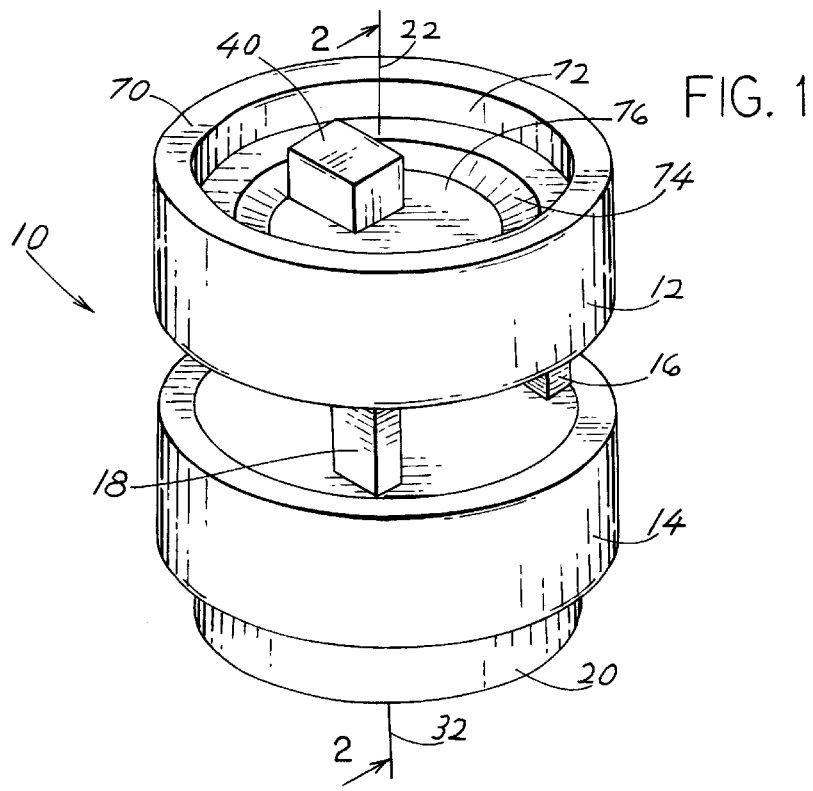
FIG. 1 is a schematic perspective view of an embodiment of an open magnet utilizing the invention.
Figure 2:
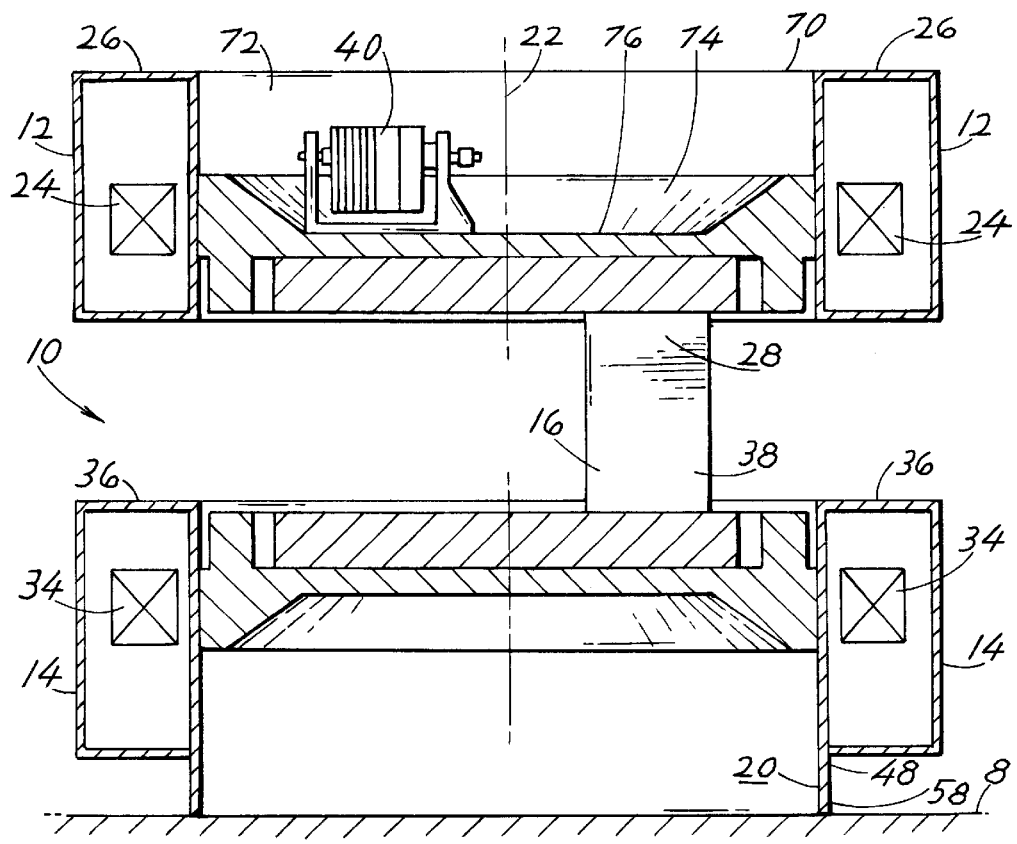
FIG. 2 is a cross-sectional view of the open magnet of FIG. 1 taken long lines 2—2 of FIG. 1 and better illustrating certain detail not included in FIG. 1.

Referring now to the drawings, wherein like numerals represent like elements throughout, FIG. 1 shows an open magnet 10 utilizing an embodiment of the present invention. The open magnet 10 includes a first assembly 12, a second assembly 14, at least one support beam 16 and 18, and a support skirt 20. The first assembly 12 has a longitudinally-extending and generally-vertically aligned first axis 22, at least one superconductive main coil 24, and a first vacuum enclosure 26. See FIG. 2. The at least one superconductive main coil 24 of the first assembly 12 is generally coaxially aligned with the first axis 22 and carries a first main electrical current in a first direction. The first direction is defined to be either a clockwise or a counterclockwise circumferential direction about the first axis 22 with any slight longitudinally component of current direction being ignored. The vacuum enclosure 26 encloses the at least one superconductive main coil 24 of the first assembly 12. The second assembly 14 is longitudinally spaced apart from and disposed generally vertically below the first assembly 12. The second assembly 14 has a longitudinally-extending second axis 32, at least one superconductive main coil 34 and second vacuum enclosure 36. The second axis 32 is generally coaxially aligned with the first axis 22. The at least one superconductive main coil 34 of the second assembly 14 is generally coaxially aligned with second axis 32 and carries a second main electrical current in the previously-described first direction. The second vacuum enclosure 36 encloses the at least one superconductive main coil 34 of the second assembly 14.

The at least one support beam 16 and 18 is generally vertically aligned, has a first end 28 attached to the first assembly 12 and a second end 38 attached to the second assembly 14. The at least one support beam 16 and 18 is non-magnetizable. A support beam 16 and 18 is non-magnetizable if it includes a portion which blocks having a magnetizable path between its ends 28 and 38. Such non-magnetizable portion would have a relative permeability of generally unity. The support skirt 20 is a generally longitudinally-extending, annularly-cylindrical structure which is generally coaxially aligned with the second axis 32, which has a first longitudinal end 48 attached to the second assembly 14, and which has a second longitudinal end 58 supportable by a floor 8.

It should be noted that additional superconductive main coils, superconductive shielding coils, superconductive correction coils and magnetizable rings may be present, as are well known to those skilled in the art, but such coils and rings have been omitted from the figures for clarity.

The first assembly 12 includes an uppermost portion 70 having a first bore 72 and a second bore 74. The second bore 74 includes a central flat 76 which lies in a plane which is generally perpendicular to the first axis 22 of the first assembly 12. It is on this flat 74 that an embodiment of the invention may be attached to the first assembly 12 of the magnet 10. Placement of the mechanical stabilizer-tuned damper 40 generally opposes the at least one support beam 16 and 18 relative to the first axis 22. One type of "clam shell" support for the first and second magnet assemblies 12 and 14 is provided when the at least one support beam 16 and 18 consists of diametrically-offset first and second support beams 16 and 18. In one example, the first and second support beams 16 and 18 are radially disposed between generally 110° and 150° apart.

Figure 4:
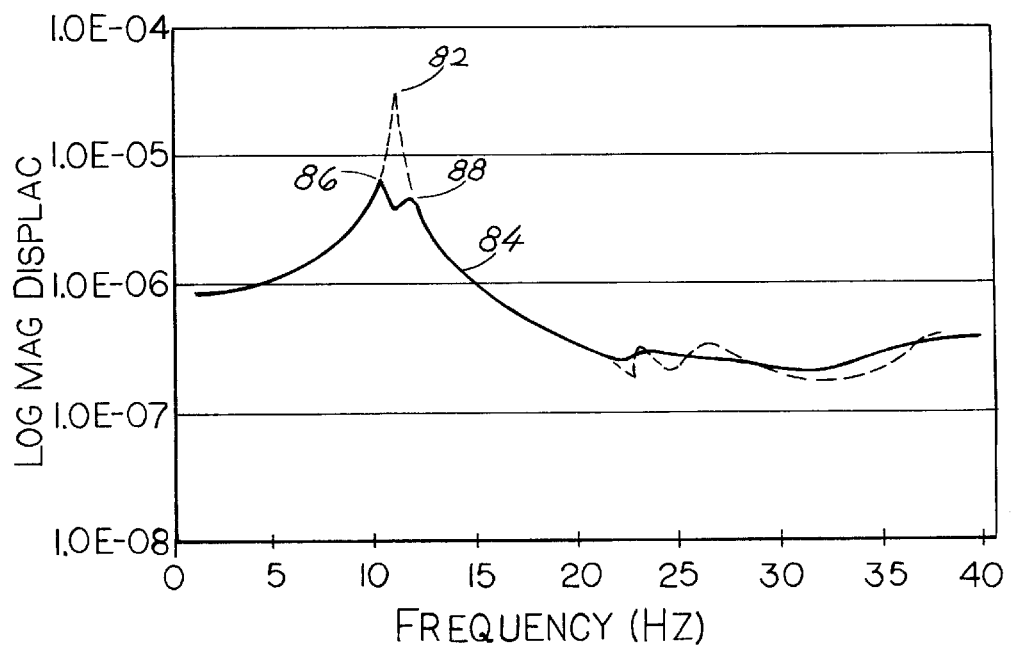
FIG. 4 is a curve depicting magnet displacement as a function of vibration frequency.
Figure 3:
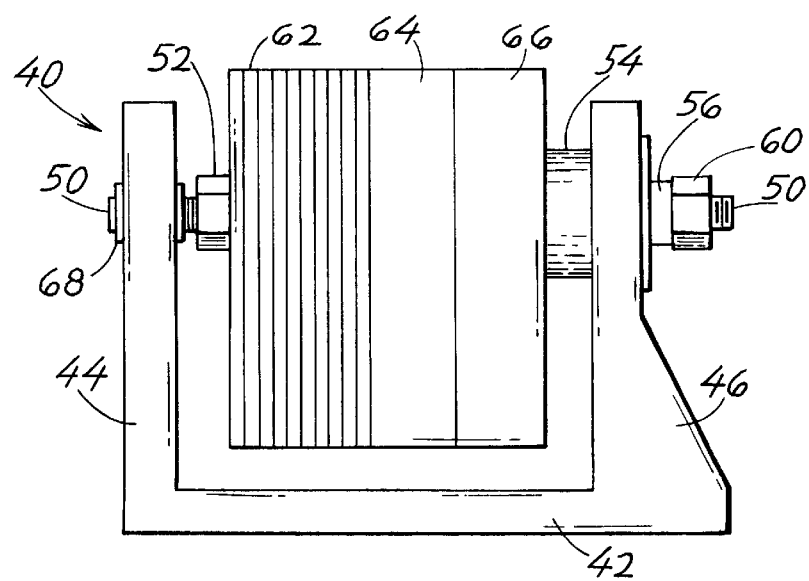
FIG. 3 is an enlarged side elevational view of the embodiment of the invention as shown in FIG. 2.

Referring to FIG. 3, one embodiment of the mechanical stabilizer-tuned damper assembly 40 is shown having a generally U-shaped support base 42. The support base 42 includes an upwardly extending first support arm 44 and an upwardly extending second support arm 46. The first and second support arms 44 and 46 include cooperatively aligned apertures (not shown) through which a central load-bearing bolt 50 is inserted. The bolt 50 is supported at the second support arm 44 by a linear bearing 68. Suspended along the bolt 50 is a series of plates 62, 64, 66, each plate having an aperture (not shown) defined within it. The plate apertures are similarly cooperatively aligned. The mass of the mechanical stabilizer-tuned damper 40 consists of the combined mass of this series of plates and the mass of the bolt 50, the base 42 and several spacer and attachment elements. Specifically, a first securement nut 60 is provided at one distal end of the bolt 50, separated from the second support arm 46 of the base 42 by a first spacer 56. Similarly, a second securement nut 52 is provided along the bolt 50 to one side of the plates 62, 64, 66, which plates are separated from the second support arm 46 of the base 42 by a second spacer 54. Each plate 62, 64, 66 is removable from the bolt 50 and is of a unique mass which provides the assembly 40 with the ability to adjust the frequency or the assembly 40 to within a few percent of the displacement component in need of displacement amplitude reduction. Each plate is non-magnetic and made from extremely low electrical conductivity material and is selected based on available space and the spring mass. Positioning of the mass plates 62, 64, 66 in relation to the support base 42 also constrains motion of the supported mass. The attachment plates 62, 64, 66 must have the capability of adjusting the tuning frequency which is accomplished through adding or removing attachment plates that change the mass and therefore the tuning frequency of the magnet 10. In short, the tuned mass damper 40 is designed to reduce the dynamic response of the primary structure, the magnet 10. The theoretical description of the effect of the mechanical stabilizer-tuned damper 40 when used with a magnet 10 is illustrated by the curve shown in FIG. 4. The large single spike 82 is the magnet's fundamental mode, its front-to-back "rocking." The line 84 below it splits into two lower amplitude peaks 86 and 88. This represents two masses and two springs, whereas the single spike 82 represents, effectively, a single mass and spring. The assembly "de-tunes" the damaging peak 82 and splits energy away from the frequency of concern with two lower amplitude peaks 86 and 88.

Several benefits and advantages are derived from the invention. As previously noted, in a vertically-aligned HFO magnet, when the support members provide a "clam-shell" support for the assemblies, such assemblies are particularly subject to vibration. Engineering analysis shows that the mechanical stabilizer-tuned damper design of the invention reduces magnet vibrations in a vertically-aligned open magnet having a clam-shell support for the assemblies. The mechanical stabilizer-tuned damper mass motion is aligned to dampen the direction of motion of the magnet. The mechanical stabilizer-tuned damper has the ability to add or subtract mass to fine-tune the magnet motion frequency to the natural frequency of the tuned damper. Engineering analysis also shows that mechanical stabilizer-tuned damper assemblies fitted to the magnet structure reduce the amplitude of motion at very specific oscillatory frequencies, particularly at the dominant low-excitation frequencies to which the open magnet is susceptible. When the tuned-damper magnet motion is properly matched, the amplitude of motion will reduce by as much as one order of magnitude, thus resulting in an improved magnetic field stability.

The foregoing description of an embodiment of the invention has been presented for purposes of illustration. It is to be understood that variations in the details of construction, the arrangement and combination of parts, and the types of materials used may be made without departing from the spirit and scope of the invention as defined by the claims appended hereto.

What is claimed is:

1. In a high field open superconducting magnet assembly, said assembly including a first superconductive main coil assembly, a second superconductive main coil assembly, and at least one support beam, a mechanical stabilizing assembly to minimize vibration between the first and second superconductive main coil assemblies of said magnet assembly comprising:
    a) a support means which is securable to said first superconductive main coil assembly;
    b) a mass which is removably attached to said support means for matching magnet motion frequency of the first superconductive main coil assembly relative to its vibrational movement towards and away from the second superconductive main coil assembly to the tuning frequency of the mechanical stabilizing assembly and for matching the direction of said magnet motion; and
    c) wherein the magnitude of vibration between the first and second superconductive main coil assemblies of said magnet assembly is decreased.

2. The stabilizing assembly of claim 1 wherein said mass comprises a plurality of weights.

3. The stabilizing assembly of claim 2 wherein said weights are of various weight amounts.

4. The stabilizing assembly of claim 3 wherein said weights are constructed of non-magnetic and low electrical conductivity material.

5. The stabilizing assembly of claim 4 wherein said support means (42) includes a support base having at least two support arms.

6. The stabilizing assembly of claim 5 wherein said support means includes a longitudinally extending support member interposed between said support arms.

7. The stabilizing assembly of claim 6 wherein said support member is a longitudinally extending support rod.

8. The stabilizing assembly of claim 7 wherein each of said weights includes an aperture for receiving said longitudinally extending support rod therethrough.

9. The stabilizing assembly of claim 8 wherein motion limiting means is provided to limit movement of said weights along said support rod.

10. The stabilizing assembly of claim 9 wherein said motion limiting means comprises a plurality of fasteners and spacers disposed along said support rod.

11. In a high field open superconducting magnet assembly, said assembly including a first superconductive main coil assembly, a second superconductive main coil assembly, and at least one support beam, said first superconductive main coil assembly having an upper assembly surface and a first and second bore defined within said upper surface and said first and second superconductive coil assmblies being axially aligned, a mechanical stabilizing assembly attached to one of said bores to minimize vibrational movement of the first superconductive main coil assembly relative to the second superconductive main coil assembly comprising:
    a) a support means mountable within the bore of said first superconductive main coil assembly;
    b) a plurality of masses removably attached to said support means for matching magnet coil motion frequency of the first superconductive main coil assembly relative to its vibrational movement towards and away from the second superconductive main coil assembly to the tuning frequency of the mechanical stabilizing assembly and for matching the direction of magnet coil motion; and
    c) wherein the magnitude between vibration of said magnet coil assemblies in the axial direction is decreased when the amount and location of the mass is properly adjusted.

12. The stabilizing assembly of claim 11 wherein said support means includes a support base having at least two support arms.

13. The stabilizing assembly of claim 12 wherein said support means includes a longitudinally extending support member interposed between said support arms.

14. The stabilizing assembly of claim 13 wherein said mass comprises a plurality of weights, each of said weights including an aperture for receiving said longitudinally extending support member therethrough.

15. The stabilizing assembly of claim 14 wherein said weights are of various weight amounts.

16. The stabilizing assembly of claim 15 wherein said weights are constructed of non-magnetic and low electrical conductivity material.

17. The stabilizing assembly of claim 16 wherein said support member is a longitudinally extending support rod.

18. The stabilizing assembly of claim 17 wherein motion limiting means is provided to limit movement of said weights along said support rod.

19. The stabilizing assembly of claim 18 wherein said motion limiting means comprises a plurality of fasteners and spacers disposed along said support rod.

20. In a high field open superconducting magnet assembly, said assembly including a generally horizontal first superconductive main coil assembly having a first and second bore, a second superconductive main coil assembly axially aligned with the first superconductive main coil assembly, and at least one support beam, a mechanical stabilizing assembly mounted on said superconducting magnet assembly to minimize vibration effects between the first superconductive main coil assembly relative to the second superconductive main coil assembly of the high field open superconducting magnet assembly comprising:
    a) a linear bearing,
    b) a support base,
    c) a central load bearing bolt, and
    d) a plurality of removable and movable non-magnetic and extremely low electrically conductive plates of various weights for matching motion frequency of the first superconductive main coil assembly, in relation to the second superconductive main coil assembly, to the tuning frequency of the mechanical stabilizing assembly and to dampen the direction of motion of the first superconductive main coil assembly in relation to the second superconductive main coil assembly,
    e) said load bearing rod being mounted through the linear bearing and the support base,
    f) wherein the magnitude of vibration between the first superconductive main coil assembly and the second main coil assembly of said superconducting magnet assembly decreases.

21. The superconducting magnet assembly of claim 20 wherein the first superconductive main coil assembly has an upper horizontal surface and said support base is attached to the horizontal surface of said first superconducting main coil assembly.

22. The superconducting magnet assembly of claim 21 wherein the mass of the mechanical stabilizing assembly consists of the combined mass of the removable, non magnetic and extremely low electrically conductive plates the central load bearing bolt, and a member of attachment elements.

23. The superconducting magnet assembly of claim 22 wherein the mechanical stabilizing assembly is adjustable to reduce the amplitude of motion at low-excitation frequencies to which the open magnet is susceptible.

24. The superconducting magnet assembly of claim 23 wherein the mass of the mechanical stabilizer assembly is tuned to the natural frequency of the tuned damper.

25. The superconducting magnet assembly of claim 24 wherein the mass damper is tuned to reduce the amplitude of vibration between 9 and 14 herz.

26. An open architecture superconducting magnet assembly comprising
    a coil assembly having
        a generally cylindrical lower bore, said bore having a generally horizontal top,
        a lower superconductive main coil surrounding the lower bore,
        a nonmagnetizable support beam rising from the lower bore,
        an upper bore situated above the lower bore and supported by the support beam,
        an upper superconductive main coil surrounding the upper bore, and
        a generally cylindrical upper bore flat defined within the upper bore; and
    a mechanical stabilizer tuned damper assembly attached to the upper bore flat for reducing the vibration of the upper bore and upper main coil having,
        a base attached to the upper bore flat,
        a first support arm having a lower end attached to the base and an upper end, said upper end being perpendicular to the base and having an aperture between the upper end and the lower end of the support arm,
        a second support arm having a lower end attached to the base and an upper end, said support arm being perpendicular to the base and having an aperture aligned with the first aperture between the upper end and the lower end of the support arm,
        a linear bearing seated within the aperture in the second support arm,
        a central load bearing bolt inserted through the aperture in the first support arm and the linear bearing in the second support arm,
        a first securement nut securing the bolt to the first support arm,
        a second securement nut securing the bolt to the second support arm,
        a plurality of removeable nonmagnetic plates of extremely low electrical conductivity each having a generally central aperture that accomodates the central load bearing bolt, and
        a plurality of spacers used to separate the plates such that the mass damper reduces the amplitude of the dynamic response of the upper bore and upper main magnet relative to the lower bore and lower main magnet.

27. An open architecture superconducting magnet assembly comprising
    a coil assembly having
        a generally cylindrical lower bore, said bore having a generally horizontal top,
        a lower superconductive main coil surrounding the lower bore,
        a nonmagnetizable support beam rising from the lower bore,
        an upper bore situated above the lower bore and supported by the support beam,
        an upper superconductive main coil surrounding the upper bore, and
        a generally cylindrical upper bore flat defined within the upper bore; and
    a mechanical stabilizer tuned damper assembly attached to the upper bore flat for reducing the vibration of the upper bore and upper main coil having,
        a base attached to the upper bore flat,
        a first support arm having a lower end attached to the base and an upper end, said upper end being perpendicular to the base and having an aperture between the upper end and the lower end of the support arm,
        a second support arm having a lower end attached to the base and an upper end, said support arm being perpendicular to the base and having an aperture aligned with the first aperture between the upper end and the lower end of the support arm,
        a linear bearing seated within the aperture in the second support arm,
        a central load bearing bolt inserted through the aperture in the first support arm and the linear bearing in the second support arm,
        a first securement nut securing the bolt to the first support arm,
        a second securement nut securing the bolt to the second support arm,
        a plurality of removeable nonmagnetic plates of extremely low electrical conductivity each having a generally central aperture that accomodates the central load bearing bolt, and
        a plurality of spacers used to separate the plates such that the mass damper reduces the amplitude of the dynamic response of the upper bore and upper main magnet relative to the lower bore and lower main magnet.

28. The open architecture superconducting magnet assembly of claim 27 wherein the mass damper uses a plurality of differently weighted plates.

29. The open architecture superconducting magnet assembly of claim 28 wherein the plates along the mass damper are adjustable to reduce the amplitude of motion at low-excitation frequencies.

30. The open architecture superconducting magnet assembly of claim 29 wherein the plates along the mass damper are adjustable to reduce the amplitude of magnet motion between the frequencies of 9 and 13 herz.

* * * * *